(12) United States Patent
Yonekawa

(10) Patent No.: US 6,433,351 B1
(45) Date of Patent: **\*Aug. 13, 2002**

(54) EXPOSURE APPARATUS AND CONTROL METHOD FOR CORRECTING AN EXPOSURE OPTICAL SYSTEM ON THE BASIS OF AN ESTIMATED MAGNIFICATION VARIATION

(75) Inventor: Masami Yonekawa, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/324,042

(22) Filed: Jun. 2, 1999

(30) Foreign Application Priority Data

Jun. 4, 1998 (JP) ............................................. 10-170546

(51) Int. Cl.$^7$ ................................................ G01N 21/86
(52) U.S. Cl. .................................. 250/559.3; 250/201.2
(58) Field of Search ............................. 250/548, 559.3, 250/208.1, 559.4, 559.44, 201.2; 356/399–401, 375; 355/53, 55

(56) References Cited

U.S. PATENT DOCUMENTS 5,528,027 A * 6/1996 Mizutani .................... 250/234
6,018,384 A * 1/2000 Ota ............................. 355/53

FOREIGN PATENT DOCUMENTS

| JP | 4-192317 | 7/1992 |
| JP | 9-246168 | 9/1997 |

\* cited by examiner

Primary Examiner—Que T. Le
(74) Attorney, Agent, or Firm—Fitzpatrick, Cella, Harper & Scinto

(57) ABSTRACT

In an exposure apparatus for projecting illumination light irradiating a reticle on a wafer via an optical system, a mark magnification variation $\Delta\beta_M$ is calculated from the displacement amounts of a plurality of position measurement marks used for reticle alignment. From the mark magnification variation $\Delta\beta_M$, a shot magnification $\Delta\beta_S$ is estimated using an estimation equation having an aspect ratio A and area ratio S of the exposure region as parameters:

$$\Delta\beta_S = c \cdot A^p \cdot S^q \cdot \Delta\beta_M$$

(where c, p, q are coefficients). The shot magnification is corrected based on the estimation result using the magnification correction function of a projection lens.

56 Claims, 13 Drawing Sheets

EXPOSURE APPARATUS AND CONTROL METHOD FOR CORRECTING AN EXPOSURE OPTICAL SYSTEM ON THE BASIS OF AN ESTIMATED MAGNIFICATION VARIATION

BACKGROUND OF THE INVENTION

1. Field of the Invention

The present invention relates to an exposure apparatus for sequentially projecting an electronic circuit pattern formed on a reticle surface onto respective shots on a wafer surface via a projection optical system in manufacturing a semiconductor element such as an IC or LSI and, more particularly, to a semiconductor manufacturing exposure apparatus having a function of, even if the reticle absorbs exposure light to thermally expand during projection exposure, immediately detecting this, converting it into a shot magnification component, and quickly correcting the shot magnification component using a magnification correction function of a projection lens.

2. Description of the Related Art

Recently, as semiconductor integrated circuit patterns such as IC and LSI patterns continue to shrink in feature size, the projection exposure apparatus is demanded for high resolution, high overlay accuracy, and high throughput.

At present, the mass production line of each LSI manufacturer tends to use an exposure apparatus having high resolution for a critical layer and an exposure apparatus having low resolution but high throughput for an uncritical layer in order to increase COO (Cost Of Ownership). To cope with a process of the Mix & Match method using different apparatuses, variations in magnification and distortion in the shot must be suppressed in addition to shifts in the shot matrix, magnification errors, and rotation errors on the wafer.

In particular, as for variations in the shot, variations in magnification and distortion by thermal expansion of the reticle upon absorbing illumination light have recently surfaced. Since the reticle is made of silica glass, the glass itself has an absorption index of several % or less for exposure light (KrF 243 nm, i-line, g-line, and the like) and a low linear expansion coefficient of 0.5 ppm/° C., and thus thermal expansion of a conventional reticle does not pose any problem. However, the Cr pattern absorbs a large amount of exposure energy because of high luminance of an illumination lamp for increasing throughput or a three-layered Cr surface for preventing flare of an optical system. The silica glass rises in temperature during a heat conduction process to thermally expand.

To avoid this phenomenon, the temperature rise is avoided by spraying conditioned air on the reticle. However, this is not practical because the temperatures of the air and reticle cannot be made equal, the apparatus becomes bulky, and the effects are low for a reticle formed with a pellicle.

There is proposed another method (e.g., Japanese Patent Laid-Open No. 4-192317) of estimating the thermal deformation amount of the reticle by numerical calculation such as the difference calculus or finite-element method on the basis of various exposure parameters (reticle surface illuminance, pattern density, and the like), and correcting the magnification or distortion component using the correction means of a projection optical system. However, this method is basically an open-loop correction. The thermal deformation amount of the reticle is difficult to estimate by numerical calculation for the use of various modified illuminations, phase shift reticles, pellicle-formed reticles, or the like in an actual process, and the use of a combination of them.

Accordingly, a so-called closed-loop correction method of directly measuring and correcting thermal deformation of the reticle is adopted. That is, thermal deformation of the reticle is measured using an existing position measurement mark used to align the reticle by a reticle stage, and is corrected based on the result using the distortion correction means of the projection optical system.

This method will be briefly explained with reference to FIGS. 3 to 5. In FIG. 3, reference numeral 1 denotes a reticle; and 2 and 3, position measurement marks formed on the lower surface of the reticle. In FIG. 4, reference numeral 4 denotes a base which supports a reticle stage (not shown); and 5 and 6, reference marks formed on the base at positions where they face the reticle position measurement marks 2 and 3. In measuring thermal deformation of the reticle, shifts ($\Delta x$, $\Delta y$) of the position measurement marks 2 and 3 are measured with reference to the reference marks 5 and 6, as shown in FIG. 5. From this result, the magnification component generated on the reticle is corrected using the distortion correction means of the projection optical system.

This method is, however, unsatisfactory.

A process for an actual element does not always use the maximum image field (e.g., 22 mm×22 mm) of the exposure apparatus. The image field is often limited by a masking device to a rectangular shape such as two or three chips by one shot depending on the chip size. In this case, according to the above method, since the edge of an actual shot is apart from the position measurement mark, the magnification variation in the shot is different from the magnification variation of the position measurement mark.

FIG. 6 shows this state. In FIG. 6, reference numeral 7 denotes a rectangular actual element area. FIG. 7 schematically shows the temperature distribution and deformation when exposure light is incident on this area to attain a thermally steady state. In FIG. 7, reference numeral 1$a$ denotes a deformed reticle; and 2$a$ and 3$a$, displaced disposition measurement marks. If the circuit pattern region has a rectangular shape long in the y direction, like this example, the temperature distribution has an elliptical shape long in the y direction, and thermal deformation along with this also becomes prominent in the y direction. As for the shot magnification variation, the y-direction magnification component greatly changes. Despite this, since the reticle position measurement marks 2$a$ and 3$a$ are positioned near the edge of the reticle, the magnification component calculated from the mark displacement does not reflect an actual shot magnification.

When a circuit pattern region 8 is much smaller than the maximum illumination region, as shown in FIG. 8, the temperature distribution has a small concentric shape, as shown in FIG. 9. For the same reason, the magnification component calculated from the mark displacement does not reflect an actual shot magnification, either.

As described above, the conventional method cannot accurately monitor the shot magnification variation using the mark magnification variation.

SUMMARY OF THE INVENTION

The present invention has been made to solve the above problems, and has as its object to provide an exposure apparatus and exposure control method capable of accurately estimating magnification variations in an exposure region regardless of changes in shape of the exposure region.

More specifically, when the shot magnification component generated by thermal deformation of a reticle is to be calculated from the displacement of a position measurement mark on an existing reticle, the shot magnification component can be accurately estimated even if the exposure region changes to an arbitrary size by a masking device.

It is another object of the present invention to correct the shot magnification component generated on the reticle from the estimation result using the magnification correction means of a projection lens.

It is still another object of the present invention to accurately, easily estimate magnification variations in an exposure region having an arbitrary shape by using either one of the aspect ratio and area of the exposure region as shape information of the exposure region.

It is still another object of the present invention to increase the exposure precision by correcting the magnification by the projection lens on the basis of the estimated magnification variation.

It is still another object of the present invention to execute magnification correction and minimize a decrease in throughput by execution of magnification correction when the estimated magnification variation reaches a level that poses problems in a required exposure precision.

It is still another object of the present invention to execute estimation of the magnification variation for every predetermined exposure amount in units of wafers or shots, thereby minimizing a decrease in throughput by execution of magnification correction.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

According to a preferred embodiment of the present invention, a shift between an existing reticle position measurement mark used for reticle alignment and a paired reference mark is always measured to calculate a mark magnification variation $\Delta\beta_M$. An estimation equation for estimating an actual shot magnification variation $\Delta\beta_S$ from the magnification variation $\Delta\beta_M$ of the position measurement mark is stored in a console. The shot magnification variation $\Delta\beta_S$ is always monitored by calculation using the estimation equation. Since this estimation equation has the aspect ratio and exposure area of the shot as parameters, an actual shot magnification can be estimated with high precision even for an arbitrary image field by a masking device.

If the shot magnification is determined to reach a level that poses problems in an actual exposure process, the shot magnification component generated on the reticle is corrected by a projection lens using the magnification correction function of a known projection lens, and then exposure operation restarts. Subsequently, the shot magnification is estimated from the measurement result of the reticle position measurement means to always monitor the shot magnification. If the shot magnification is determined to reach this level, the same operation is repeated.

With this processing, even when the reticle absorbs illumination light and thermally expands, the thermal deformation amount is measured using an existing reticle position measurement means. The result is used in the estimation equation for estimating the shot magnification. Consequently, the magnification can be quickly corrected by the projection lens to always print a high-quality circuit pattern on the wafer.

Figure 10:
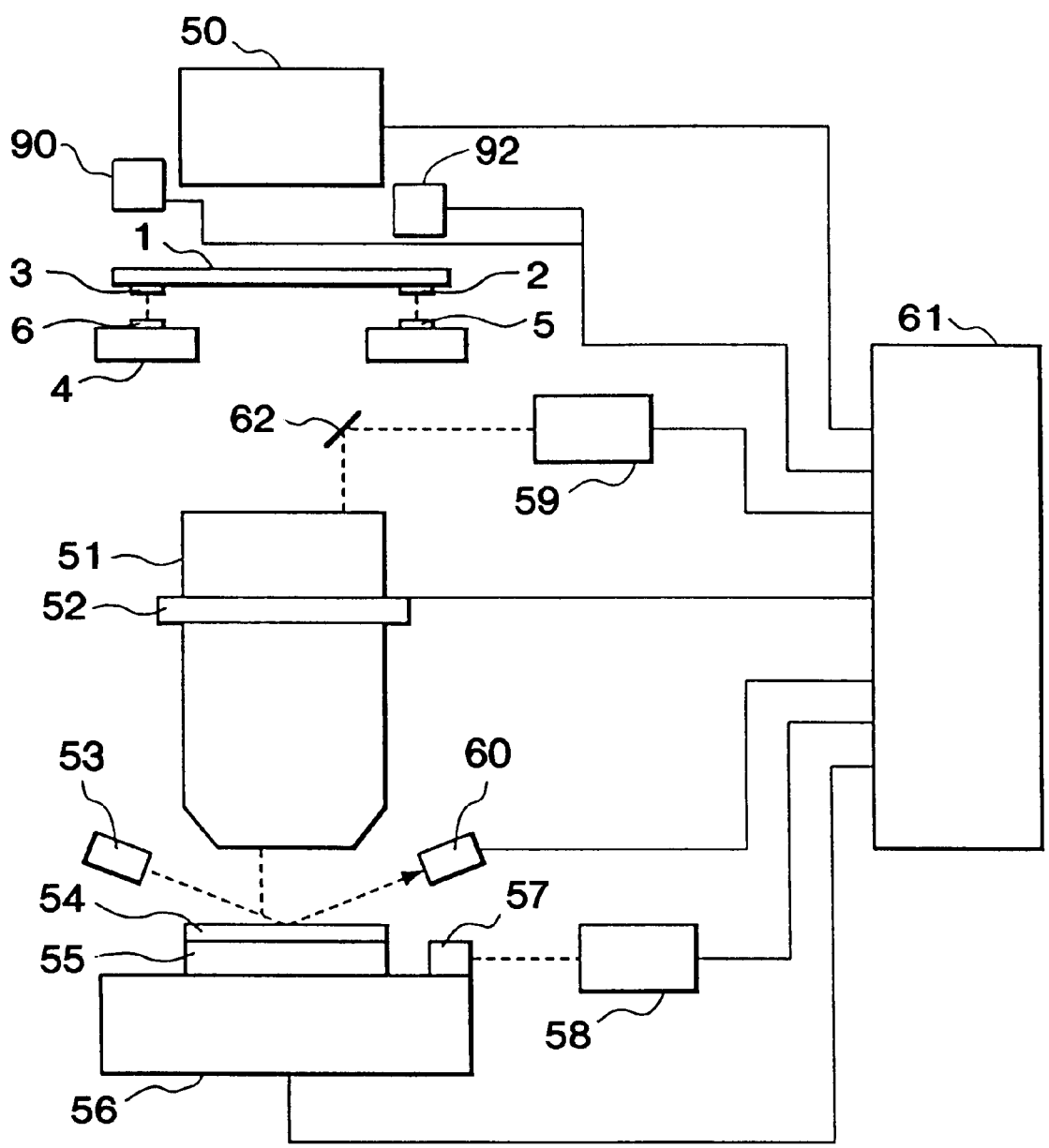
FIG. 10 is a schematic view showing the concept of an apparatus to which the present invention is applied.

Prior to a description of the principal part of the present invention, the arrangement of a projection exposure apparatus to which the present invention is applied will be briefly described by exemplifying a stepper with reference to FIG. 10.

In FIG. 10, reference numeral 50 denotes an illumination system; 1, a reticle on which a circuit pattern is formed and position measurement marks 2 and 3 are drawn; and 4, a base which mounts a reticle stage (not shown) and has reference marks 5 and 6 at positions where they face the marks 2 and 3. The reticle 1 is aligned with reference to the reticle stage base 4 by use of mark measurement unit 90, which detects marks 3 and 6, and mark measurement unit 92, which detects marks 2 and 5, respectively.

Reference numeral 51 denotes a projection lens for projecting a reticle pattern image on a wafer 54; 52, a known lens drive unit for correcting changes in imaging performance by air pressure and temperature; 62, a mirror for deflecting probe light for measuring wafer alignment by an off-axis TTL (Through The Lens) method; and 59, a measurement system for the mirror 62.

Reference numerals 53 and 60 denote known focus/wafer tilt detectors which irradiate the surface of the wafer 54 with a light beam (53), and photoelectrically detect the reflected light (60), thereby detecting the in-focus position of the projection lens 51 and the tilt of the wafer 54.

Reference numeral 55 denotes a wafer chuck for vacuum-chucking the wafer 54; 56, a wafer stage capable of moving coarsely and finely in the x, y, and θ directions. The position of the wafer stage 56 is always monitored by an interferometer mirror 57 and interferometer 58. The whole exposure apparatus including these main units is controlled by the console unit 61.

A shot magnification correction method according to embodiments of the present invention will be described.

Figure 3:
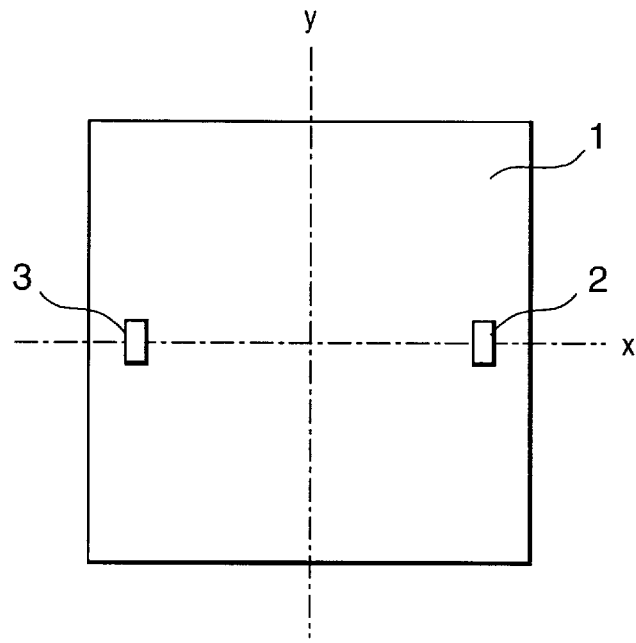
FIG. 3 is a plan view showing a reticle and reticle position measurement mark.
Figure 4:
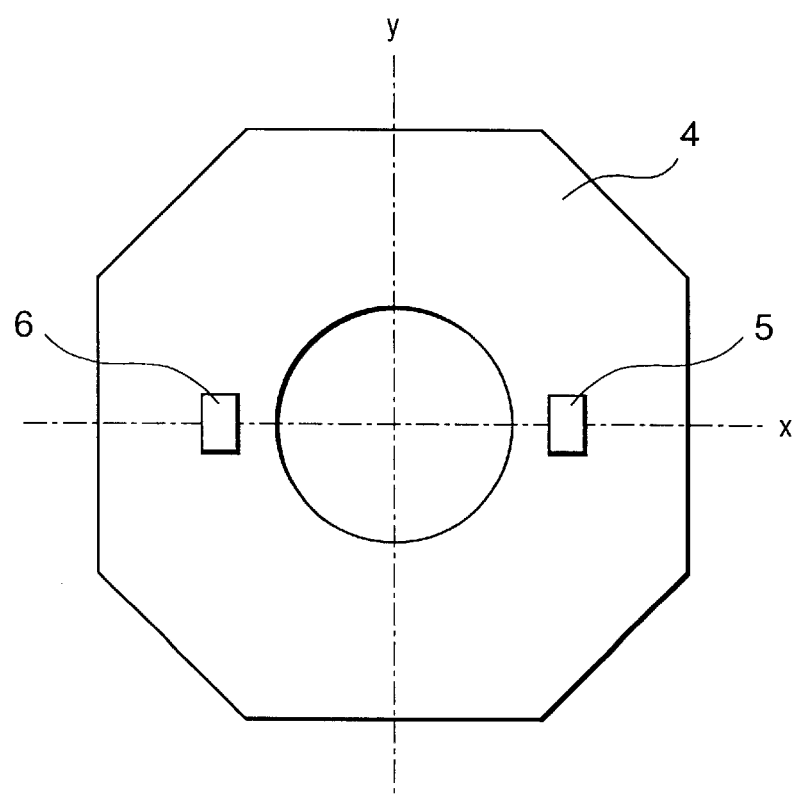
FIG. 4 is a plan view showing a reticle stage base and reference mark.
Figure 5:
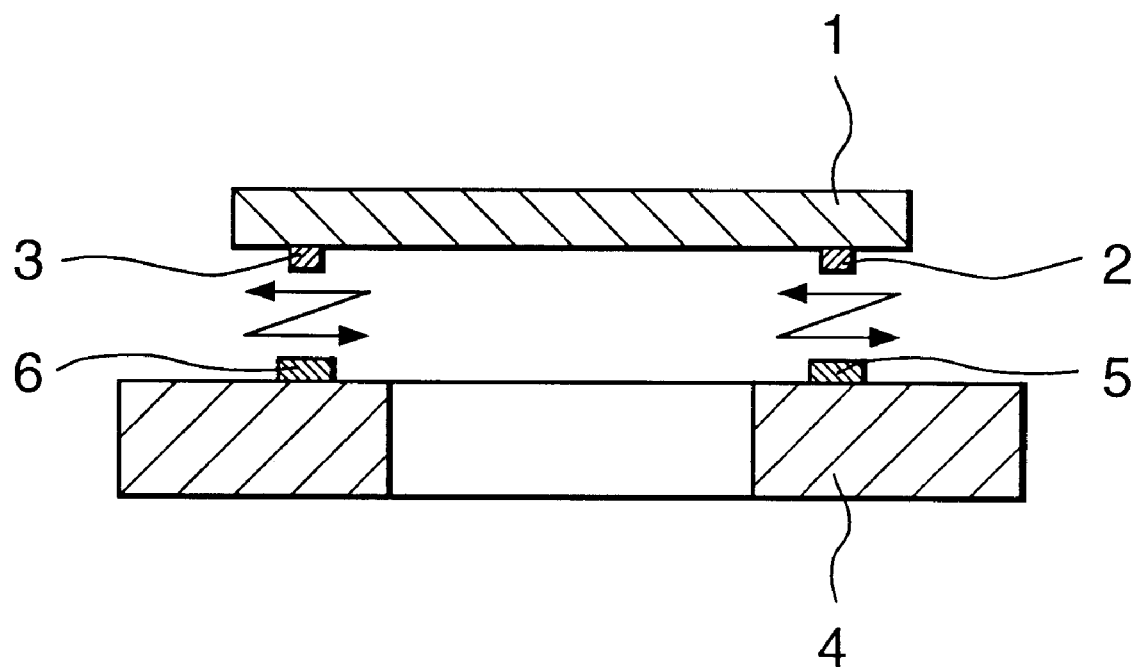
FIG. 5 is a sectional view showing the positional relationship between the reticle and reticle stage base.
Figure 6:
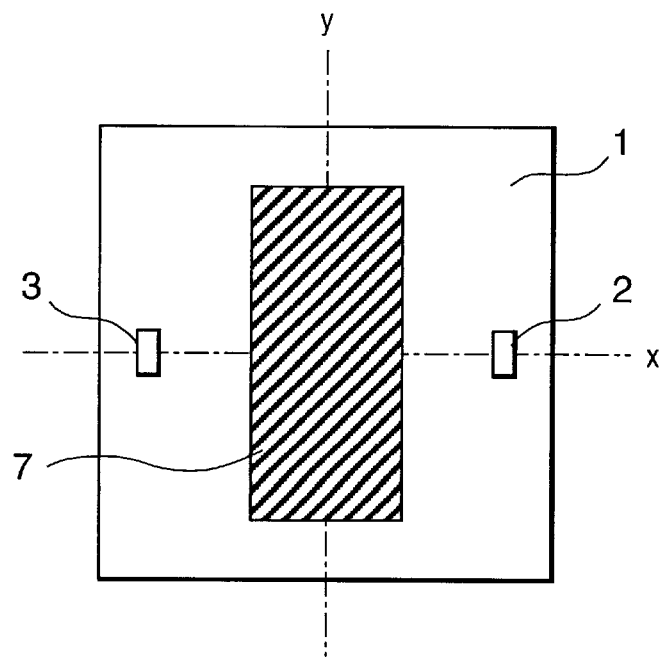
FIG. 6 is a plan view showing a reticle having a rectangular circuit pattern region.
Figure 7:
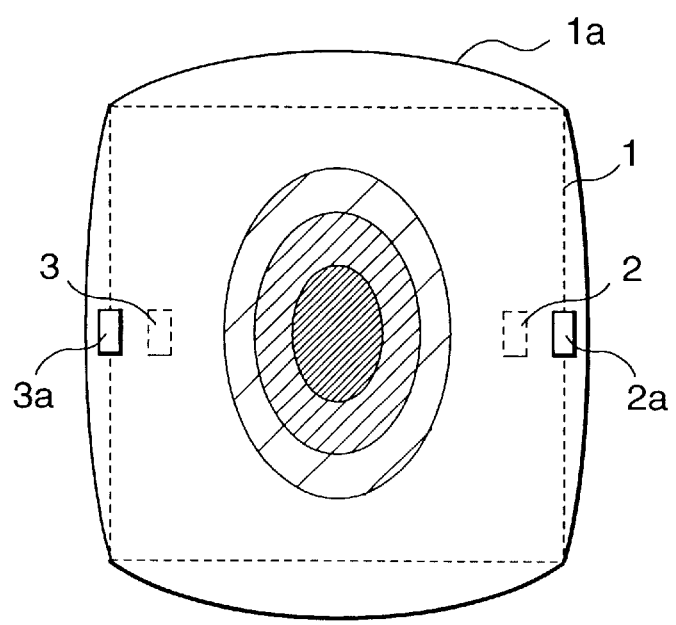
FIG. 7 is a plan view showing the thermal deformation and temperature distribution of the reticle in FIG. 6.
Figure 8:
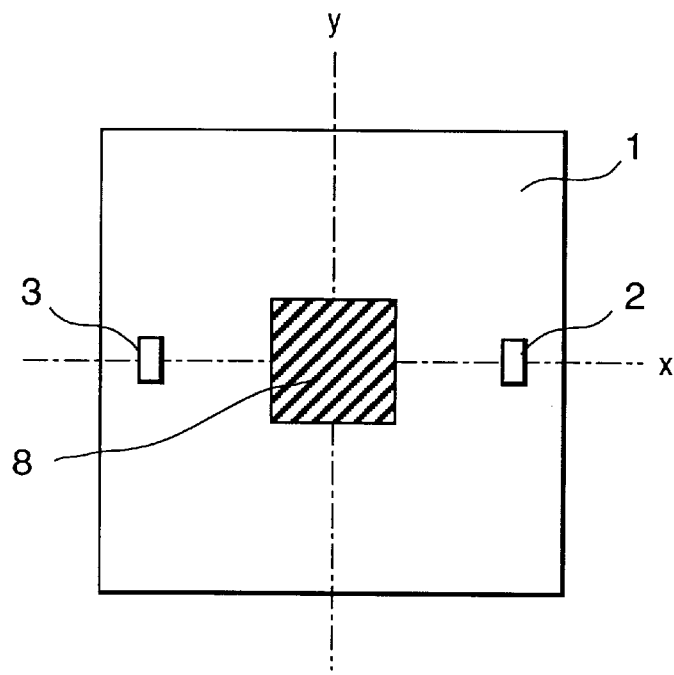
FIG. 8 is a plan view showing a reticle having a small square circuit pattern region.
Figure 9:
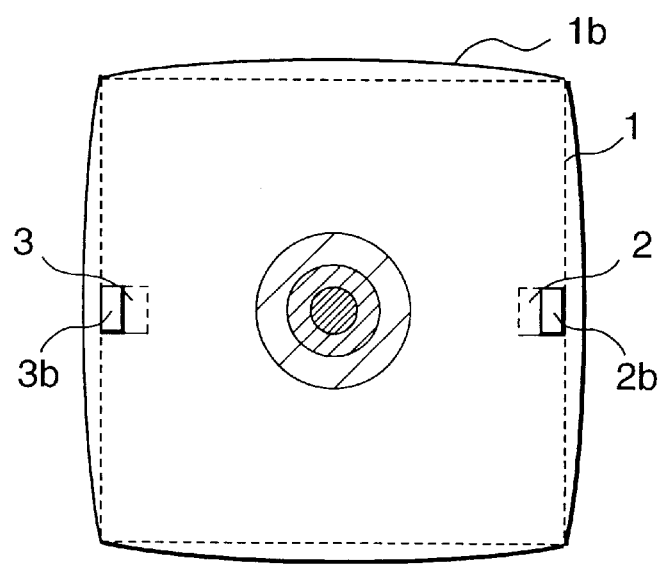
FIG. 9 is a plan view showing the thermal deformation and temperature distribution of the reticle in FIG. 8.

As described above with reference to FIGS. 3 to 5, the reticle position measurement mark and reference mark important in the present invention will be explained. As is apparent from FIGS. 3 to 5, thermal deformation of the reticle is obtained by measuring a change in distance between the reticle position measurement marks 2 and 3 relative to the distance between the reference marks 5 and 6. Note that the x and y coordinates of the positions of the reticle position measurement marks 2 and 3 can be detected, and can be expressed by $(x^{(i)}_R, y^{(i)}_R)$ and $(x^{(i)}_L, y^{(i)}_L)$ where i is the number of measurement operations.

Prior to exposure, the reticle 1 having the two position measurement marks is aligned with reference to the reference marks of the reticle stage base 4. In this state, exposure starts. During intermittent exposure, the Cr pattern of the reticle absorbs exposure light to rise in temperature and thermally deform. As described above, since silica glass used as the base material of the reticle has a low linear expansion coefficient of 0.5 ppm, when the density (area ratio) of the Cr pattern is low, thermal expansion of the reticle does not pose any problem. However, when the density (area ratio) of the Cr pattern is high, the pattern absorbs a large amount of exposure energy, and the silica glass rises in temperature during a heat conduction process to thermally expand.

Figure 11:
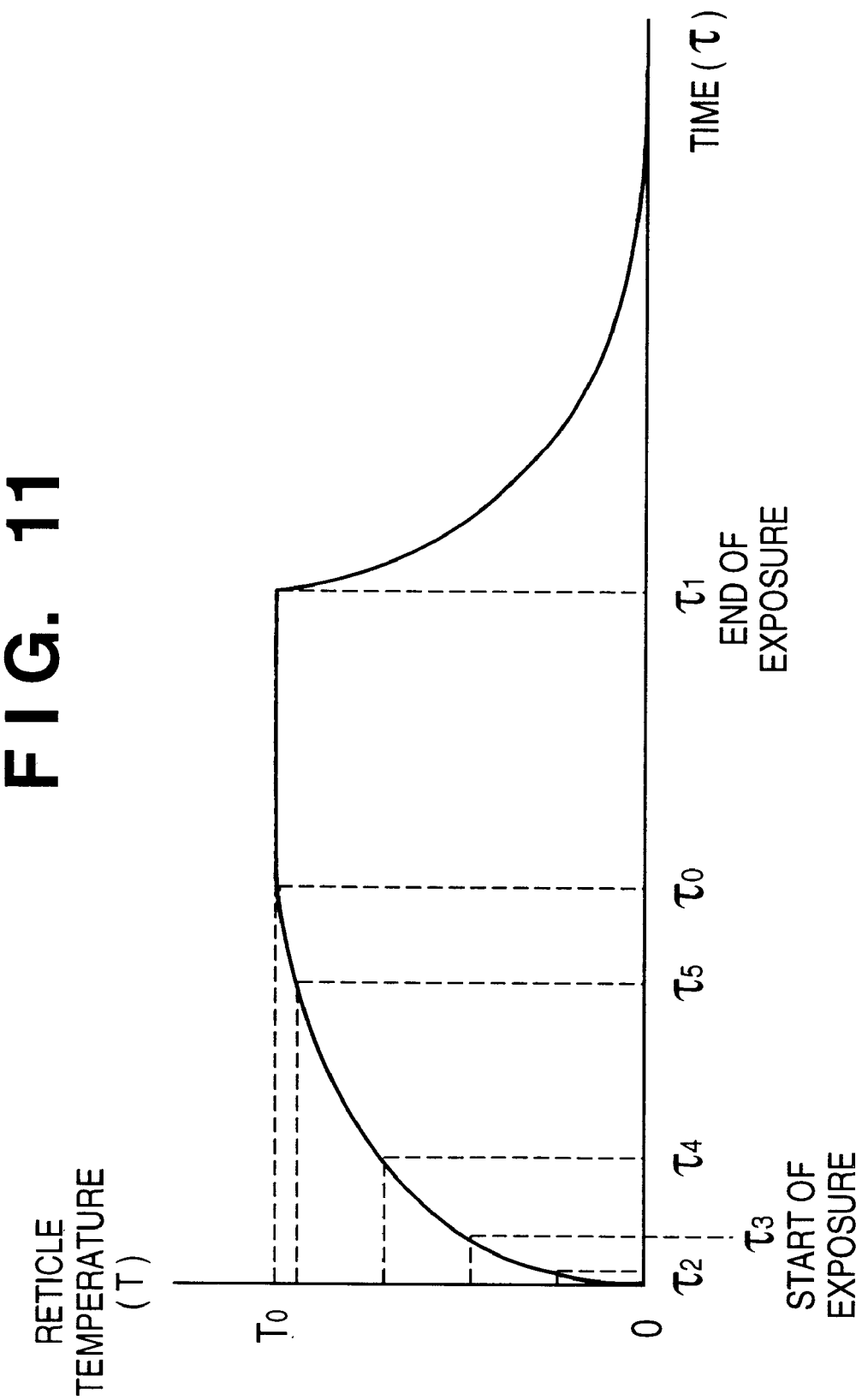
FIG. 11 is a graph showing a transient temperature rise of a reticle having a high Cr pattern density.
Figure 12:
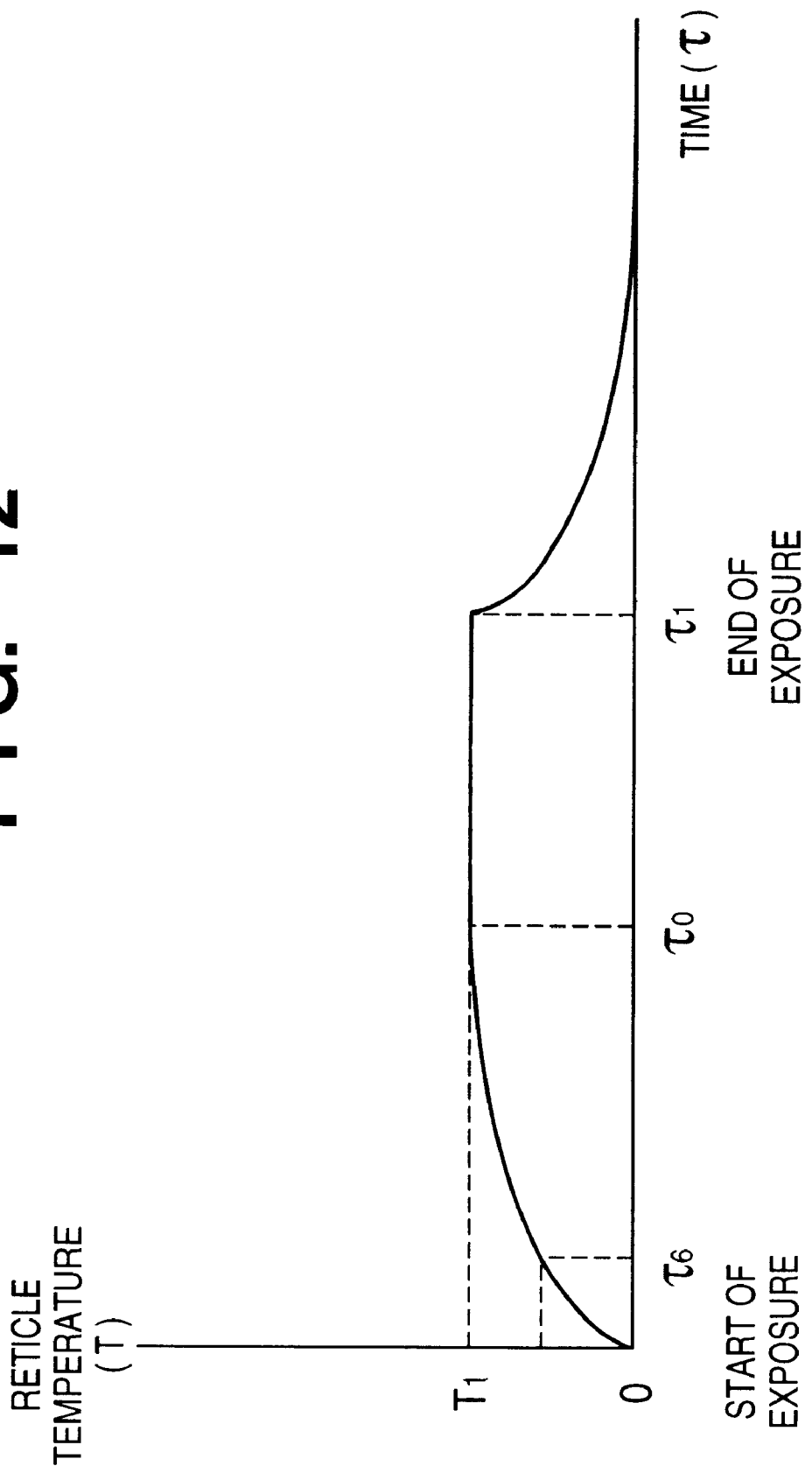
FIG. 12 is a graph showing a transient temperature rise of a reticle having a low Cr pattern density.

FIGS. 11 and 12 show the reticle temperature plotted along the time on the abscissa. FIGS. 11 and 12 respectively show the reticle temperature when the Cr pattern density is high and low. The temperature rise of the reticle traces a normal unsteady heat conduction process. That is, when exposure starts at $\tau=0$, the temperature gradually rises to trace the curve of an error function $erf(\epsilon)$. At given time $\tau=\tau_0$, the temperature reaches a steady state at the maximum temperature $T=T_0$. Exposure is stopped at $\tau=\tau_1$, and then the temperature traces an inverse curve to the rise curve to fall and reach the steady state again. What is important in this process is an unsteady-state section ($0 \leq \tau \leq \tau_0$) from the start of exposure to the steady state. According to the present invention, thermal expansion of the reticle is appropriately detected in this section and converted into a shot magnification, and this shot magnification is efficiently corrected using the magnification-distortion correction function of the projection lens.

The present invention attaches importance to the step of estimating the shot magnification component generated by thermal deformation of the reticle from the magnification component calculated based on the displacement of an existing reticle position measurement mark, i.e., an estimation equation calculation method, which will be explained.

In an actual semiconductor process, the exposure region on the reticle changes depending on a designed circuit pattern. If the exposure region is unchanged, the total energy amount absorbed by the reticle and the thermal deformation amount can be considered to be proportional to each other. Therefore, assume that the total absorption energy amount is constant.

Figure 13:
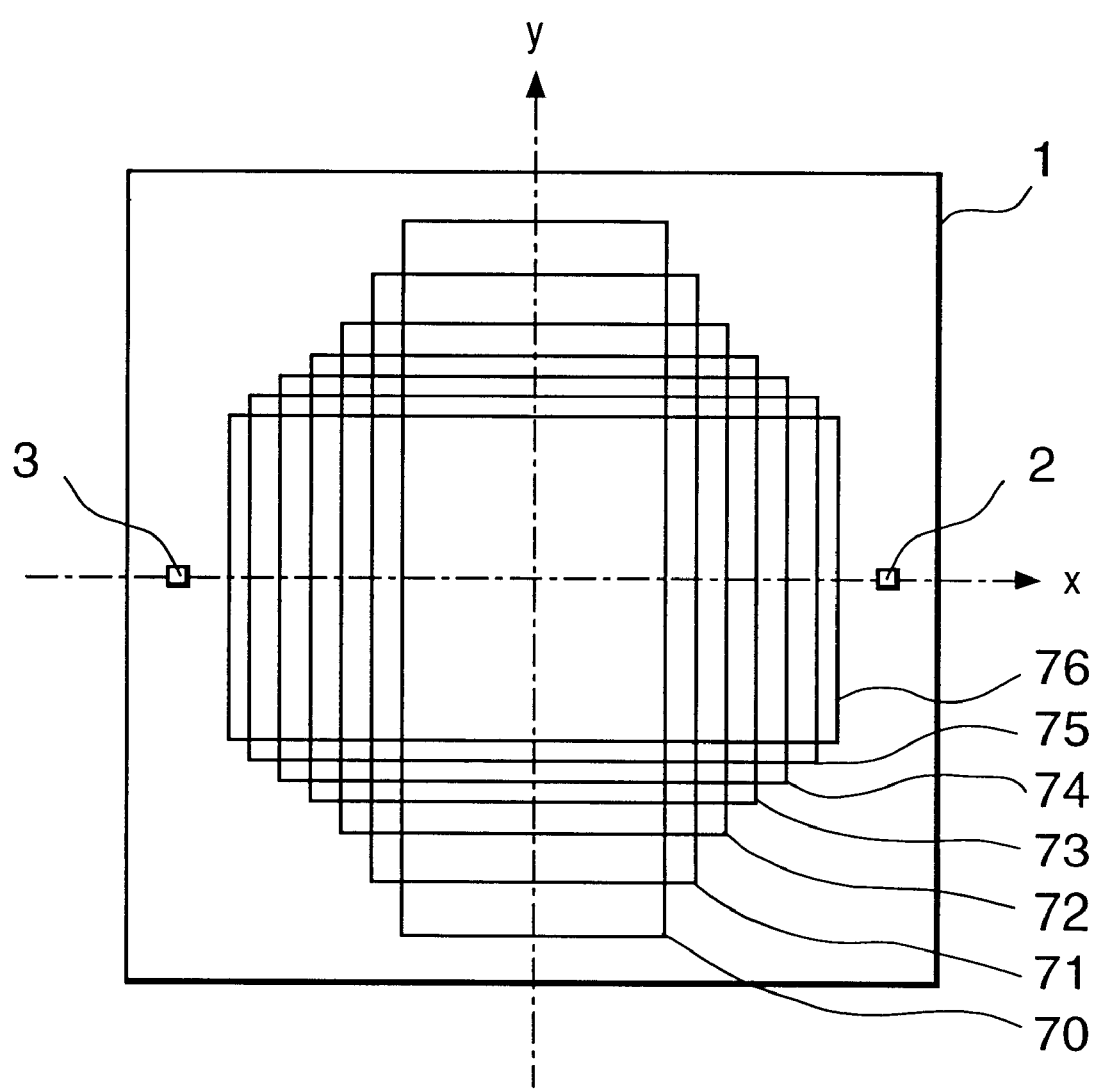
FIG. 13 is a plan view showing a masking size for calculating a shot magnification estimation equation.

The relationship between the aspect ratio of the exposure region, mark magnification variation, and shot magnification variation is examined by an experiment or simulation. As shown in FIG. 13, the aspect ratio of the exposure region is arbitrarily changed from 70 to 76 with a constant exposure area to obtain mark magnification variations and actual shot magnification variations at respective aspect ratios. More specifically, the mark magnification variation is calculated from displacements $(\Delta x^{(i)}_R, \Delta y^{(i)}_R)$ and $(\Delta x^{(i)}_L, \Delta y^{(i)}_L)$ of the right and left reticle position measurement marks a sufficient time after the start of exposure (L is the distance between the marks):

$$\Delta \beta^{(i)}_M = (\Delta x^{(i)}_R - \Delta x^{(i)}_L)/L$$

The shot magnification variation $\Delta \beta^{(i)}_S$ at this time is calculated. The relationship between the mark and shot magnification variations $\Delta \beta^{(i)}_M$ and $\Delta \beta^{(i)}_S$ is examined at several aspect ratios while the shot area is kept unchanged. The simulation results by the present inventor reveal that, letting an aspect ratio A be (breadth (x) size)/(length (y) size) of the shot, as the aspect ratio increases, the mark magnification variation $\Delta \beta^{(i)}_M$ comes close to the shot magnification variation $\Delta \beta^{(i)}_S$. Hence, when the aspect ratio A is used as a parameter, the shot magnification can be given using a power p of the aspect ratio A as a parameter:

$$\Delta \beta^{(i)}_S = c_1 \cdot A^p \cdot \Delta \beta^{(i)}_M \quad (1)$$

where $c_1$ is a coefficient.

Figure 14:
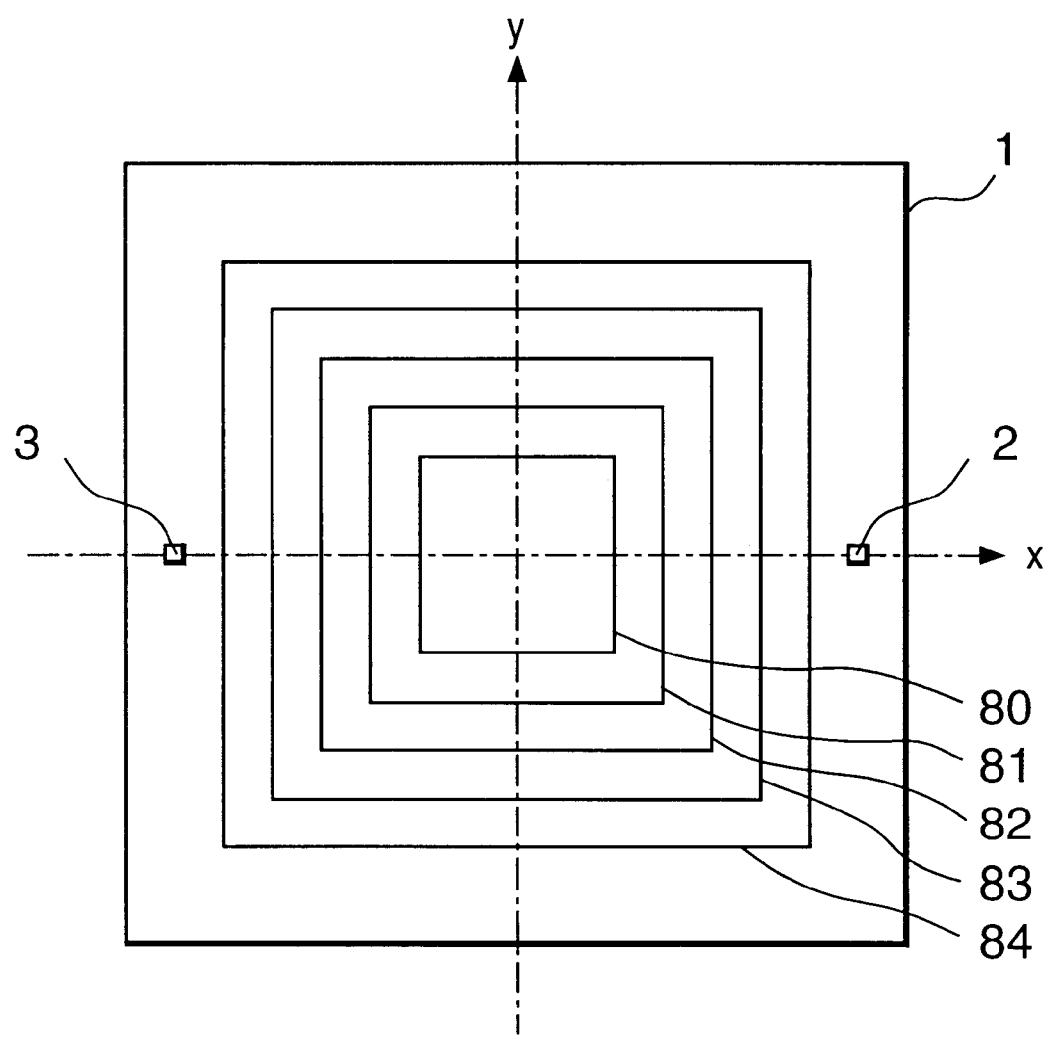
FIG. 14 is a plan view showing another masking size for calculating the shot magnification estimation equation.

The relationship between the shot area, mark magnification variation, and shot magnification variation is examined by an experiment or simulation. As shown in FIG. 14, the exposure region area is arbitrarily changed from 80 to 84 with a constant aspect ratio (=1) to obtain mark magnification variations and actual shot magnification variations at respective areas. More specifically, the mark magnification variation is calculated from displacements $(\Delta x^{(j)}_R, \Delta y^{(j)}_R)$ and $(\Delta x^{(j)}_L, \Delta y^{(j)}_L)$ of the right and left reticle position measurement marks a sufficient time after the start of exposure in the jth exposure region on the reticle (L is the distance between the marks):

$$\Delta \beta^{(j)}_M = (\Delta x^{(j)}_R - \Delta x^{(j)}_L)/L$$

A shot magnification variation $\Delta \beta^{(j)}_S$ at this time is calculated. The relationship between the mark and shot magnification variations $\Delta \beta^{(j)}_M$ and $\Delta \beta^{(j)}_S$ is examined at several exposure areas while the aspect ratio is kept unchanged. The simulation results by the present inventor reveal that, letting an exposure area ratio S be shot area/reference area (reference area: the area of a square region at the mark position), as the area ratio increases to 1, the shot edge and mark position come close to each other. When the exposure area ratio S is used as a parameter, the shot magnification can be given using a power q of the exposure area ratio S as a parameter:

$$\Delta \beta^{(j)}_S = c_2 \cdot S^q \cdot \Delta \beta^{(j)}_M \quad (2)$$

where $C_2$ is a coefficient.

The shot magnification variation can be given by a combination of equations (1) and (2) at an arbitrary aspect ratio A and exposure area ratio S:

$$\Delta \beta_S = c \cdot A^p \cdot S^q \cdot \Delta \beta_M \quad (3)$$

In practice, the coefficients c, p, and q are calculated by an experiment and simulation using the least squares method on the basis of this model equation, thereby determining the estimation equation.

A method of correcting a thermally expanded reticle by the magnification correction means of the projection lens will be explained. At certain time after the start of exposure, if the mark magnification component $\Delta\beta_M$ calculated from shifts ($\Delta x_R$, $\Delta y_R$) and ($\Delta x_L$, $\Delta y_L$) from the initial coordinates of the respective reticle position measurement marks is generated, the shot magnification $\Delta\beta_M$ is estimated using equation (3). In an actual sequence, the magnification component $\Delta\beta_S$ generated on the reticle 1 is controlled by an open loop of calculating a lens drive amount corresponding to the magnification component by the console 61 shown in FIG. 10 and inputting the command value to the magnification correction unit 52 to correct the magnification component.

The above description concerns the concept of the method of correcting the shot magnification generated by thermal deformation of the reticle according to the present invention.

Detailed embodiments of the present invention will be described below with reference to the accompanying drawings.

First Embodiment

Figure 1:
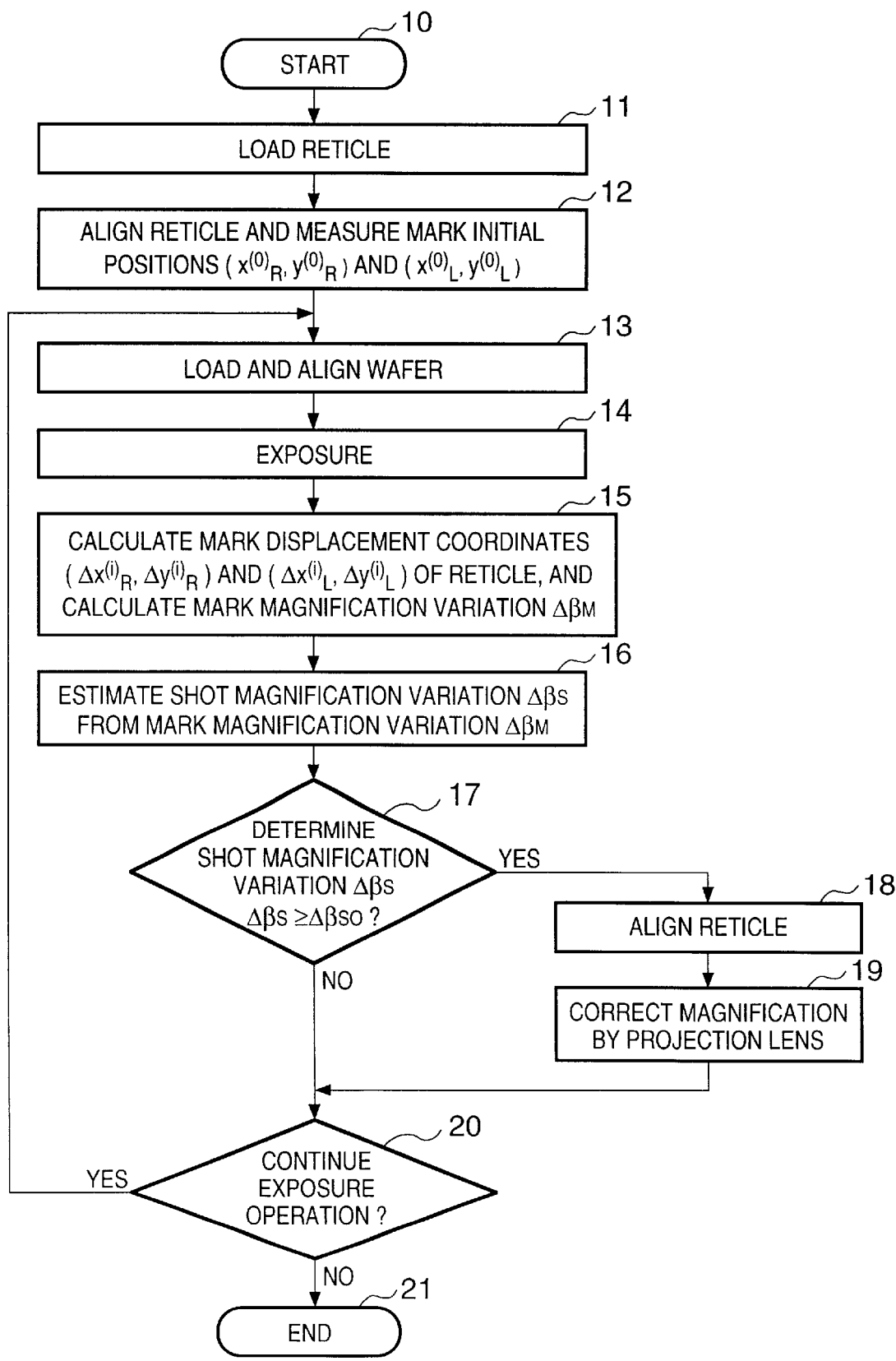
FIG. 1 is a flow chart showing exposure and reticle shot magnification correction sequences according to the first embodiment of the present invention.

An exposure sequence according to the present invention will be explained with reference to FIG. 1.

The sequence starts (step 10), and a reticle 1 is loaded onto the reticle stage and chucked (step 11). The reticle 1 is aligned using two reticle position measurement marks (2, 3) with reference to reference marks (5, 6) formed on a reticle stage base 4. The measurement coordinates of the reticle position measurement marks (2, 3) at this time are set to ($\Delta x^{(0)}_R$, $\Delta y^{(0)}_R$) and ($\Delta x^{(0)}_L$, $\Delta y^{(0)}_L$), which are used as initial measurement values (step 12). The first wafer 54 is conveyed from a convey system onto a wafer chuck 55, chucked by the wafer chuck 55, and aligned (step 13). The first wafer 54 is exposed (step 14).

In loading the reticle in step 11, parameters (aspect ratio A and area ratio S) representing the shape of the shot region of this reticle are set in a console 61. These parameters may be set manually or automatically by making the parameters on the reticle and reading them by the apparatus.

After exposure for all shots is complete, the wafer is replaced. During this replacement, the positions of the position measurement marks (2, 3) of the reticle 1 are measured to calculate shifts (($\Delta x^{(1)}_R$, $\Delta y^{(1)}_R$) and ($\Delta x^{(1)}_L$, $\Delta y^{(1)}_L$)) from the initial mark positions of the reticle position measurement marks. Based on these shifts, the mark magnification variation $\Delta\beta^{(1)}_M$ is calculated (step 15). From this magnification variation, the shot magnification variation is estimated using equation (3), i.e., $$\Delta\beta_S = c \cdot A^p \cdot S^q \cdot \Delta\beta_M \qquad (3)$$

(step 16). This shot magnification variation $\Delta\beta^{(1)}_S$ is compared with a shot magnification variation allowable value $\Delta\beta_{S0}$ calculated in advance from the line width and overlay accuracy of a target process (step 17).

If the calculated shot magnification variation $\Delta\beta^{(1)}_S$ is equal to or larger than the shot magnification variation allowable value $\Delta\beta_{S0}$, the exposure sequence shifts to a reticle magnification correction sequence (steps 18 and 19). If $\Delta\beta^{(1)}_S$ is smaller than $\Delta\beta_{S0}$, exposure operation is continued until exposure of all wafers is complete (step 20). At this time, the reticle immediately after the start of exposure hardly thermally deforms, exposure operation is determined to be continued, and the sequence returns to step 13 to process the second wafer. The execution interval of a series of shot magnification variation estimation processes (steps 15 to 17) may change depending on the process. When the pattern density of the reticle is high, and the exposure energy and duty are large, the estimation processes are done every wafer. When the pattern density of the reticle is low, and the exposure energy and duty are small, the estimation processes may be done in units of 5 or 10 wafers. In the first embodiment, the estimation processes are done every wafer in order to always monitor thermal deformation of the reticle.

Note that the unit number of wafers for which the estimation processes are executed may be manually set in the console 61.

As this loop (i.e., exposure operation for the wafer) is repeated, the reticle temperature gradually rises. If the shot magnification variation $\Delta\beta^{(i)}_S$ estimated in step 16 is determined by the ith mark measurement to be larger than the shot magnification variation allowable value $\Delta\beta_{S0}$, the sequence advances from step 17 to step 18 to shift to magnification correction operation. In step 18, reticle alignment is performed for an expanded reticle, errors are assigned to the respective marks so as to minimize the sum of squares of errors caused by the expansion, and the reticle is aligned in the x, y, and θ directions by the reticle stage. A magnification correction unit 52 of the projection lens operates in accordance with a magnification correction value of the projection lens corresponding to the generated shot magnification variation $\Delta\beta^{(i)}_S$, thereby correcting the magnification of the lens (step 19).

If the magnification is ideally corrected, no reticle magnification variation is generated on the wafer, and the alignment measurement values of the reticle marks at this time are newly set as initial mark positions. The initial mark positions are used to measure the respective mark positions of the reticle at the restart of exposure. The sequence returns to the main sequence, a new wafer is loaded onto the stage and aligned (step 13), and the sequence of the present invention restarts. In this fashion, every time the estimated shot magnification variation $\Delta\beta^{(i)}_S$ exceeds the shot magnification variation allowable value $\Delta\beta_{S0}$, the reticle magnification is corrected. If all wafers to be processed are exposed, this process ends (step 21).

The first embodiment of the present invention has been described. An application of the present invention to an actual process will be explained. The present invention is applied until the reticle reaches a thermally steady state. For example, when the pattern density of the reticle is high, and the exposure energy and duty are large, the reticle temperature also greatly changes, as shown in FIG. 11, and reticle magnification correction operation is executed at times τ2, τ3, τ4, and τ5. That is, correction is done at a short correction interval immediately after the start of exposure because the reticle temperature abruptly rises, and at a long correction interval very close to the steady state because the temperature hardly changes. When the pattern density of the reticle is low, and the exposure energy and duty are small, the reticle temperature hardly changes, as shown in FIG. 12, and thus reticle magnification correction operation is done only once at time τ6.

Second Embodiment

The second embodiment of the present invention will be described.

Figure 2:
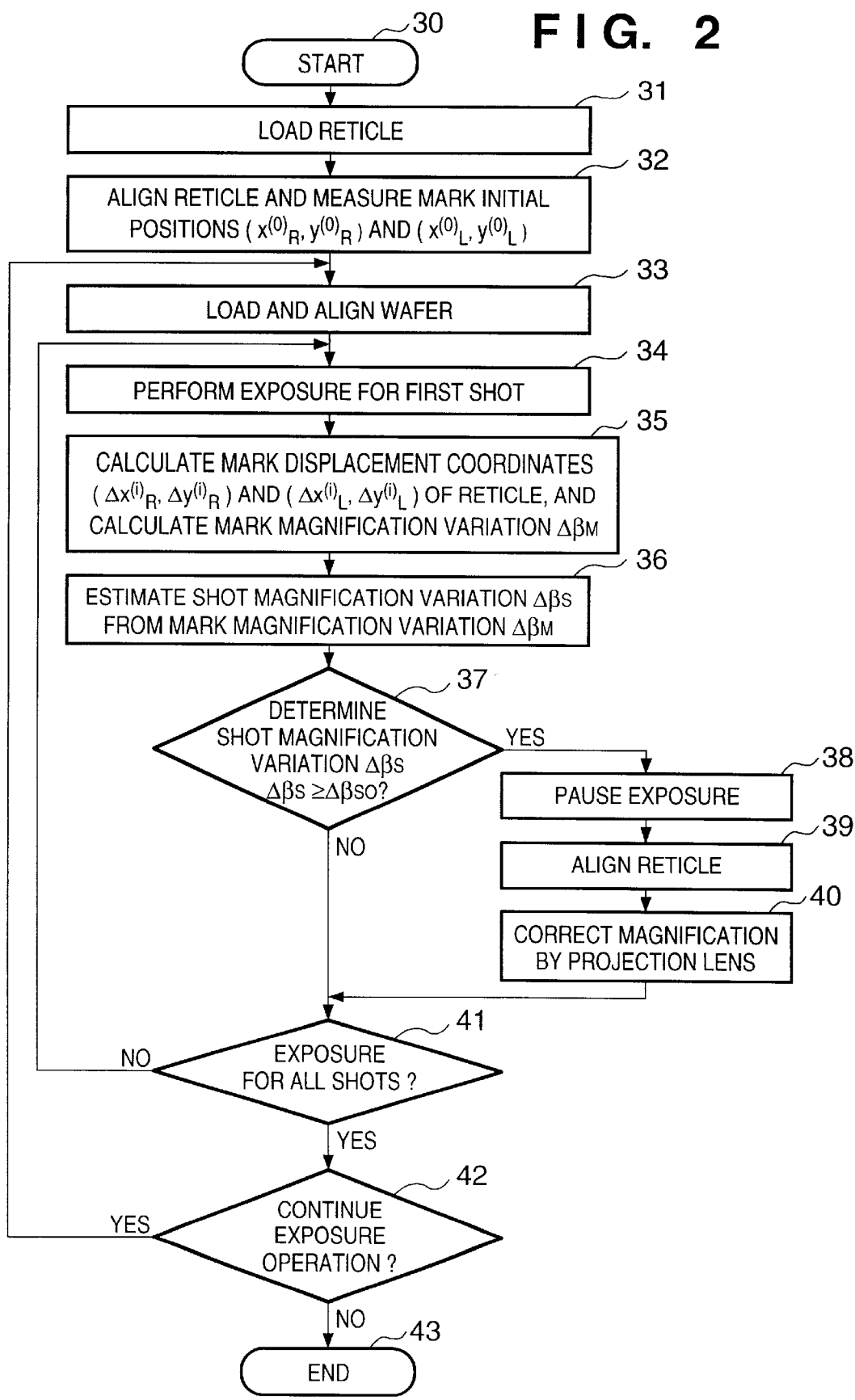
FIG. 2 is a flow chart showing exposure and reticle shot magnification correction sequences according to the second embodiment of the present invention.

This embodiment is characterized by a sequence of correcting the shot magnification variation on the reticle in units of shots. This will be explained with reference to FIG. 2.

Steps 30 to 33 are the same as steps 10 to 13 in the first embodiment. A sequence of monitoring the shot magnification variation on the reticle in units of shots, which is a feature of the second embodiment, will be explained. In step 34, the first shot of the first wafer is exposed. While the wafer stage moves to the second shot and is aligned at a predetermined position, shifts (($\Delta x^{(1)}_R$, $\Delta y^{(1)}_R$) and ($\Delta x^{(1)}_L$, $\Delta Y^{(1)}_L$)) from the initial mark positions of position measurement marks (2, 3) of a reticle 1 are measured. Based on these measurement values, the mark magnification variation $\Delta\beta^{(1)}_S$ is calculated. From this magnification variation, the shot magnification variation is estimated using equation (3), i.e., $$\Delta\beta_S = c \cdot A^p \cdot S^q \cdot \Delta\beta_M \quad (3)$$

(step 16). The estimated shot magnification variation $\Delta\beta^{(1)}_S$ is compared with a shot magnification variation allowable value $\Delta\beta_{S0}$ calculated in advance from the line width and overlay accuracy of a target process (step 37).

If $\Delta\beta^{(1)}_S$ is equal to or larger than $\Delta\beta^{(1)}_S$, the sequence shifts to a reticle magnification correction sequence (steps 38, 39, and 40). If $\Delta\beta^{(1)}_S$ is smaller than $\Delta\beta_{S0}$, exposure operation is continued until exposure of all shots on all wafers is complete (step 41). At this time, the reticle immediately after completion of exposure of the first shot hardly thermally deforms, exposure operation is determined to be continued, and the sequence returns to step 34 to perform exposure for the second shot. The execution interval of a series of shot magnification variation estimation processes in steps 35 to 37 may change depending on the process. When the pattern density of the reticle is high, and the exposure energy and duty are large, the estimation processes are done every shot exposure. When the pattern density of the reticle is low, and the exposure energy and duty are small, the estimation processes may be done in units of 10 or 20 shots. In the second embodiment, the estimation processes are done every shot exposure in order to always monitor thermal deformation of the reticle every shot.

Note that the unit number of exposure shots for which the estimation processes are executed may be manually set in a console 61.

As this loop (i.e., exposure operation for each shot region) is repeated, the reticle temperature gradually rises. If the estimated shot magnification variation $\Delta\beta_S$ is determined by the ith mark measurement to be larger than the shot magnification variation allowable value $\Delta\beta_{S0}$, the sequence shifts to magnification correction operation (steps 38 to 40). In step 38, exposure operation is paused, reticle alignment is performed for an expanded reticle, errors are assigned to the respective marks so as to minimize the sum of squares of errors caused by the expansion, and the reticle is aligned in the x, y, and θ directions by the reticle stage (step 39).

A magnification correction unit 52 of the projection lens operates in accordance wit h a magnification correction value of the projection lens corresponding to the generated shot magnification variation $\Delta\beta^{(i)}_S$, thereby correcting the magnification of the lens (step 40).

If the magnification is ideally corrected, no reticle magnification variation is generated on the wafer, and the alignment measurement values of the reticle marks at this time are newly set as initial mark positions. The initial mark positions are used to measure the respective mark positions of the reticle at the restart of exposure. The sequence returns to the main sequence, and the wafer stage is aligned at a next shot position to restart the exposure sequence. In this way, every time the estimated shot magnification variation $\Delta\beta^{(i)}_S$ exceeds the shot magnification variation allowable value $\Delta\beta_{S0}$, the reticle magnification is corrected. If all shots are processed, a new wafer is conveyed onto the wafer stage and exposed again. When the shot magnification variation is monitored for each shot, correction operation is repeated as needed, and all wafers have been exposed, this process ends (step 43).

The second embodiment is especially suitable for a process suffering a large shot magnification variation of the reticle because the shot magnification variation generated on the reticle is monitored every shot, when the shot magnification variation exceeds the variation allowable value, the magnification of the projection lens is corrected, and thus the transmittance of a reticle pattern such as a contact hole is very low.

Note that the above embodiments estimate the shot magnification variation using equation (3) in order to cope with changes in both the aspect ratio and area of the exposure shot region. Alternatively, the shot magnification variation may be estimated using equation (1) if the area of the exposure shot region is constant in the process, or equation (2) if the aspect ratio is constant.

The above embodiments have exemplified the stepper. However, the present invention is not limited to the stepper and can also be applied to any apparatus so long as it uses the reference mark in reticle alignment, such as a scanner disclosed in Japanese Patent Laid-Open No. 09-246168 in which the reference mark is formed on the reticle stage.
(Embodiment of Device Manufacturing Method)

An embodiment of a device manufacturing method using the above-mentioned exposure apparatus or exposure method will be described.

Figure 15:
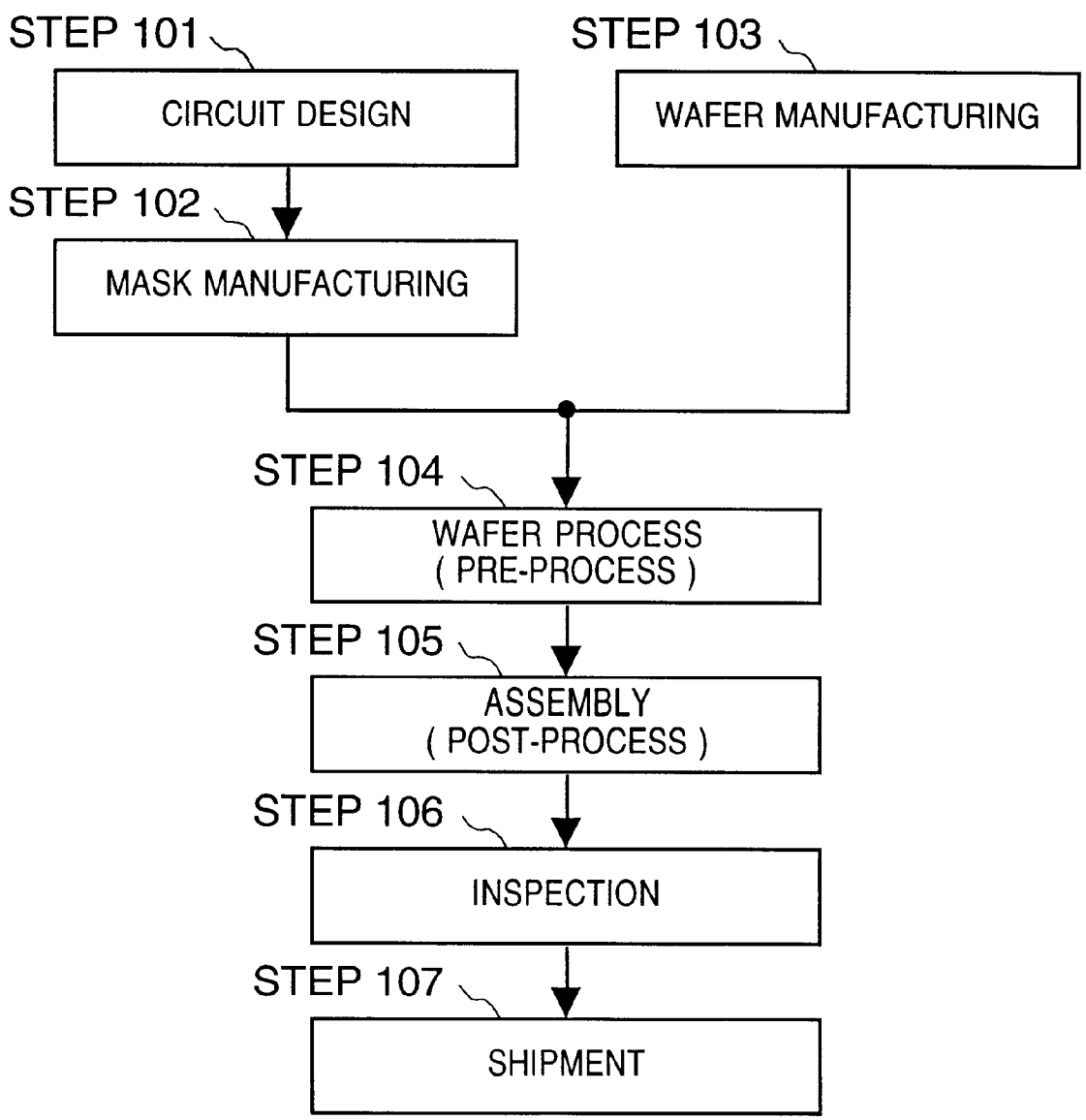
FIG. 15 is a flow chart showing a flow chart of manufacturing a microdevice.

FIG. 15 shows a flow of manufacturing a microdevice (semiconductor chip such as an IC or LSI, liquid crystal panel, CCD, thin-film magnetic head, micromachine, or the like). In step 101 (circuit design), a device pattern is designed. In step 102 (mask manufacturing), a mask having the designed pattern is manufactured. In step 103 (wafer manufacturing), a wafer is manufactured using a material such as silicon or glass. In step 104 (wafer process) called a pre-process, an actual circuit is formed on the wafer using the prepared mask and wafer by lithography. In step 105 (assembly step) called a post-step, the wafer manufactured in step 104 is formed into a semiconductor chip. The post-step includes an assembly step (dicing and boding), packaging step (chip sealing), and the like. In step 106 (inspection), inspections such as an operation confirmation test and durability test are done for the semiconductor device formed in step 105. The semiconductor device is complete through these steps and shipped (step 107).

Figure 16:
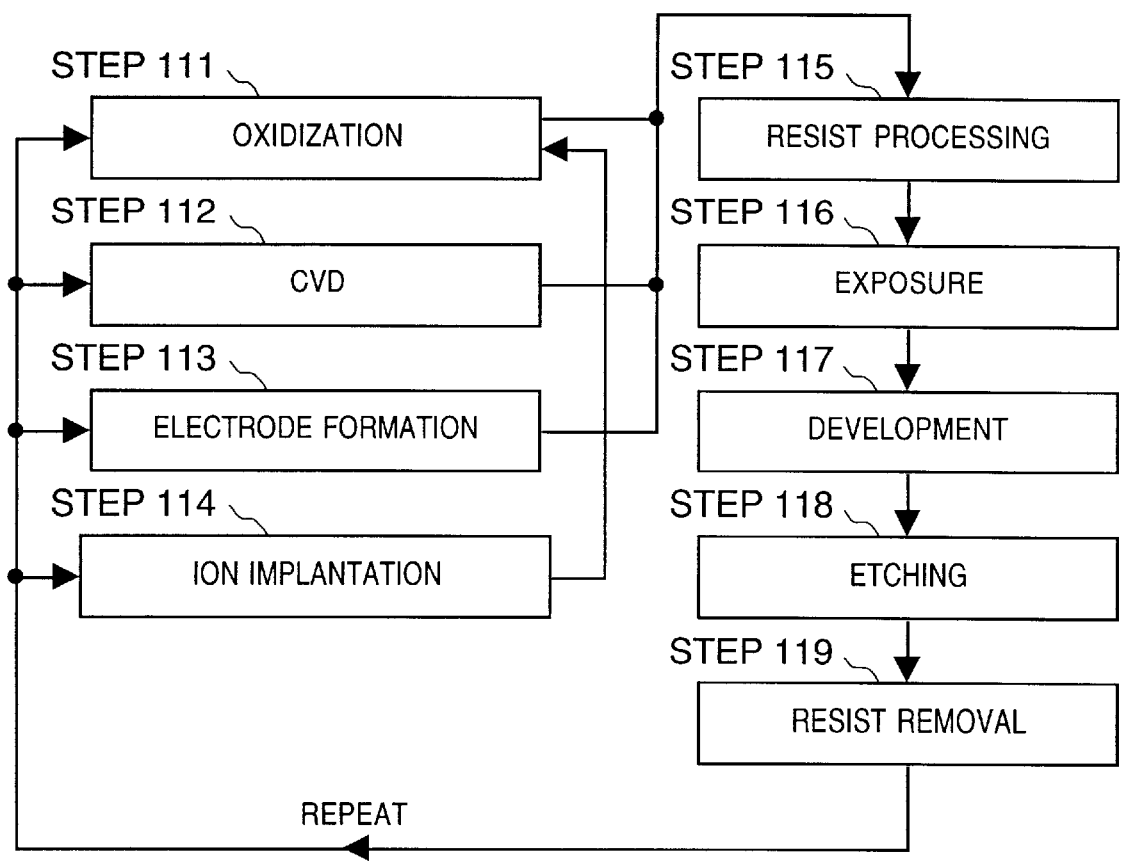
FIG. 16 is a flow chart showing a detailed flow of the wafer process.

FIG. 16 shows a detailed flow of the wafer process. In step 111 (oxidization), the wafer surface is oxidized. In step 112 (CVD), an insulating film is formed on the wafer surface. In step 113 (electrode formation), an electrode is formed on the wafer by deposition. In step 114 (ion implantation), ions are implanted in the wafer. In step 115 (resist processing), the wafer is coated with a photosensitive agent. In step 116 (exposure), the circuit pattern of a mask is printed and exposed on the wafer by the above-described exposure apparatus having the alignment device. In step 117 (developing), the exposed wafer is developed. In step 118 (etching), the portion of the pattern except for the developed resist image is etched away. In step 119 (resist removal), the unnecessary resist after etching is removed. These steps are repeatedly executed to form multiple circuit patterns on the wafer.

By using the manufacturing method of this embodiment, a high-integration-degree device, which is difficult to manufacture by the conventional method, can be manufactured at low cost.

As has been described in detail, according to the present invention, even if the reticle is irradiated with exposure light and thermally deforms to influence the shot overlay accuracy, the mark magnification variation is calculated from the displacement amount of the reticle position measurement mark using the estimation equation by the present inventor, thereby estimating the shot magnification variation. The shot magnification variation can always be monitored to quickly correct the shot magnification on the reticle using the magnification correction function of the projection lens.

In the present invention, since the displacement amount of the reticle is directly measured by the reticle position measurement mark, the shot magnification on the reticle can be estimated without any complicated process using a modified illumination, phase shift register, and the like. When the shot magnification variation of the reticle is determined to exceed the allowable value, the reticle is realigned, and a thermal deformation error is assigned to each mark. Therefore, even if asymmetrical thermal deformation of the reticle occurs, the magnification correction function of the projection lens can be effectively used.

As a result, a high-quality circuit pattern can always be printed on the wafer without depending on the shot magnification variation along with thermal deformation of the reticle. The present invention can be relatively easily practiced only by rewriting software without modifying the apparatus because an existing reticle position measurement mark and the magnification correction function of a known projection lens are used.

As many apparently widely different embodiments of the present invention can be made without departing from the spirit and scope thereof, it is to be understood that the invention is not limited to the specific embodiments thereof except as defined in the claims.

What is claimed is:

1. A control method for an exposure apparatus for projecting illumination light irradiating a reticle on a member to be exposed via an optical system, said control method comprising:
    the holding step of holding a parameter corresponding to a shape or a size of an exposure region on the reticle;
    the measurement step of measuring a displacement of a mark formed on the reticle with respect to a reference;
    the estimation step of estimating a magnification variation in the exposure region on the basis of the displacement of the mark measured in the measurement step and the parameter held in the holding step, by utilizing a predetermined relationship among the displacement, the parameter and the magnification variation; and
    the correction step of correcting the optical system on the basis of the magnification variation estimated in the estimation step.

2. The method according to claim 1, wherein the mark is a position measurement mark used to align the reticle.

3. The method according to claim 1, wherein the exposure region has a rectangular shape, and the parameter includes at least one of an area ratio of the exposure region to a predetermined reference square and an aspect ratio of the exposure region.

4. The method according to claim 3, wherein the parameter includes the aspect ratio of the exposure region, and
    letting $\Delta\beta_M$ be a mark magnification variation amount measured in the measurement step, A be the aspect ratio, and $c_1$ and p be coefficients, the estimation step comprises estimating, as the estimated magnification variation in the exposure region, $\Delta\beta_S$ given by $$\Delta\beta_S = c_1 \cdot A^p \cdot \Delta\beta_M.$$

5. The method according to claim 3, wherein the parameter includes the area ratio, and
    letting $\Delta\beta_M$ be a mark magnification variation amount measured in the measurement step, S be the area ratio, and $c_2$ and q be coefficients, the estimation step comprises estimating, as the estimated magnification variation in the exposure region, $\Delta\beta_S$ given by $$\Delta\beta_S = c_2 \cdot S^q \cdot \Delta\beta_M.$$

6. The method according to claim 3, wherein the parameter includes the aspect ratio and the area ratio, and
    letting $\Delta\beta_M$ be a mark magnification variation amount measured in the measurement step, A be the aspect ratio, S be the area ratio, and c, p, and q be coefficients, the estimation step comprises estimating, as the estimated magnification variation in the exposure region, $\Delta\beta_S$ given by $$\Delta\beta_S = c \cdot A^p \cdot S^q \cdot \Delta\beta_M.$$

7. The method according to claim 1, wherein the correction step comprises performing correction using a magnification correction function of the projection lens.

8. The method according to claim 1, wherein said method further comprises the determination step of determining whether the magnification variation estimated in the estimation step exceeds an allowable value, and
    the correction step comprises correcting the optical system on the basis of the estimated magnification variation when the estimated magnification variation is determined to exceed the allowable value.

9. The method according to claim 8, wherein the allowable value in the determination step is set on the basis of a required exposure precision.

10. The method according to claim 1, further comprising the control step of executing the estimation step, determination step, and correction step for every predetermined exposure amount.

11. The method according to claim 10, wherein the predetermined exposure amount is set based on the number of recording members as a unit.

12. The method according to claim 10, wherein the predetermined exposure amount is set based on the number of exposure shots to the exposure region as a unit.

13. The method according to claim 8, further comprising the alignment step of aligning the reticle on the basis of the displacement of the mark when the optical system is corrected in the correction step.

14. The method according to claim 13, wherein the alignment step comprises aligning the reticle so as to minimize the sum of squares of the displacement of the mark.

15. An exposure apparatus for projecting illumination light irradiating a reticle on a member to be exposed via an optical system, said apparatus comprising:
    holding means for holding a parameter corresponding to a shape or a size of an exposure region on the reticle;
    measurement means for measuring a displacement of a mark formed on the reticle with respect to a reference;
    estimation means for estimating a magnification variation in the exposure region on the basis of the displacement of the mark measured by said measurement means and the parameter held in said holding means, by utilizing a predetermined relationship among the displacement, the parameter and the magnification variation; and correction means for correcting the optical system on the basis of the magnification variation estimated by said estimation means.

16. The apparatus according to claim 15, wherein the mark is a position measurement mark used to align the reticle.

17. The apparatus according to claim 15, wherein the exposure region has a rectangular shape, and the parameter includes at least one of an area ratio of the exposure region to a predetermined reference square and an aspect ratio of the exposure region.

18. The apparatus according to claim 17, wherein the parameter includes the aspect ratio of the exposure region, and letting $\Delta\beta_M$ be a mark magnification variation amount measured by said measurement means, A be the aspect ratio, and $c_1$ and p be coefficients, said estimation means estimates, as the estimated magnification variation in the exposure region, $\Delta\beta_S$ given by $$\Delta\beta_S = c_1 \cdot A^p \cdot \Delta\beta_M.$$

19. The apparatus according to claim 17, wherein the parameter includes the area ratio, and letting $\Delta\beta_M$ be a mark magnification variation amount measured by said measurement means, S be the area ratio, and $c_2$ and q be coefficients, said estimation means estimates, as the estimated magnification variation in the exposure region, $\Delta\beta_S$ given by $$\Delta\beta_S = c_2 \cdot S^q \cdot \Delta\beta_M.$$

20. The apparatus according to claim 17, wherein the parameter includes the aspect ratio and area ratio of the exposure region, and letting $\Delta\beta_M$ be a mark magnification variation amount measured by said measurement means, A be the aspect ratio, S be the area ratio, and c, p, and q be coefficients, said estimation means estimates, as the estimated magnification variation in the exposure region, $\Delta\beta_S$ given by $$\Delta\beta_S c \cdot A^p S^q \cdot \Delta\beta_M.$$

21. The apparatus according to claim 15, wherein said correction means performs correction using a magnification correction function of the projection lens.

22. The apparatus according to claim 15, wherein said apparatus further comprises determination means for determining whether the magnification variation estimated by said estimation means exceeds an allowable value, and said correction means corrects the optical system on the basis of the estimated magnification variation when the estimated magnification variation is determined to exceed the allowable value.

23. The apparatus according to claim 22, wherein the allowable value in said determination means is set on the basis of a required exposure precision.

24. The apparatus according to claim 15, further comprising control means for executing said estimation means, determination means, and correction means for every predetermined exposure amount.

25. The apparatus according to claim 24, wherein the predetermined exposure amount is set based on the number of recording members as a unit.

26. The apparatus according to claim 24, wherein the predetermined exposure amount is set based on the number of exposure shots to the exposure region as a unit.

27. The apparatus according to claim 22, further comprising alignment means for aligning the reticle on the basis of the displacement of the mark when the optical system is corrected by said correction means.

28. The apparatus according to claim 27, wherein said alignment means aligns the reticle so as to minimize the sum of squares of the displacement of the mark.

29. A control method for controlling an exposure apparatus for projecting illumination light irradiating a reticle onto a member to be exposed via an optical system, said control method comprising:

a step of holding a parameter corresponding to at least one of a shape of an exposure region on the reticle and a size of an exposure region on the reticle;

a step of manufacturing a displacement of a mark formed on the reticle with respect to a reference;

a step of obtaining a magnification variation in the exposure region on the basis of the displacement of the mark measured in the measuring step and the parameter held in the holding step, by utilizing a predetermined relationship among the displacement, the parameter and the magnification variation; and a step of adjusting a projection magnification of the reticle onto the member on the basis of the magnification variation obtained in the obtaining step.

30. The method according to claim 29, wherein the mark is a position measurement mark used to align the reticle.

31. The method according to claim 29, wherein the exposure region has a rectangular shape, and the parameter includes at least one of an area ratio of the exposure region to a predetermined reference square and an aspect ratio of the exposure region.

32. The method according to claim 31, wherein the parameter includes the aspect ratio of the exposure region, and letting $\Delta\beta_M$ be a mark of magnification variation amount measured in the measuring step, A be the aspect ratio and $c_1$ and p be coefficients, the obtaining step comprises obtaining, as the magnification variation in the exposure region, $\Delta\beta_S$ given by $$\Delta\beta_S = c_1 \cdot A^p \cdot \Delta\beta_M.$$

33. The method according to claim 31, wherein the parameter includes the area ratio, and letting $\Delta\beta_M$ be a mark magnification variation amount measured in the measuring step, S be the area ratio, and $c_2$ and q be coefficients, the obtaining step comprises obtaining, as the magnification variation in the exposure region, $\Delta\beta_S$ given by $$\Delta\beta_S = c_2 \cdot S^q \cdot \Delta\beta_M.$$

34. The method according to claim 31, wherein the parameter includes the aspect ratio and area ratio, and letting $\Delta\beta_M$ be a mark magnification variation amount measured in the measuring step, A be the aspect ratio, S be the area ratio, and c, p, and q be coefficients, the obtaining step comprises obtaining, as the magnification variation in the exposure region, $\Delta\beta_S$ given by $$\Delta\beta_S = c \cdot A^p \cdot S^q \cdot \Delta\beta_M.$$

35. The method according to claim 29, wherein the adjusting step comprises performing adjustment using a magnification correction function of the projection lens.

36. An exposure apparatus for projecting illumination light irradiating a reticle onto a member to be exposed via an optical system, said apparatus comprising:

holding means for holding a parameter corresponding to at least one of a shape of an exposure region on the reticle and a size of an exposure region on the reticle;

measuring means for measuring a displacement of a mark formed on the reticle with respect to a reference;

obtaining means for obtaining a magnification variation in the exposure region on the basis of the displacement of the mark measured by said measuring means and the parameter held in said holding means, by utilizing a predetermined relationship among the displacement, the parameter and the magnification variation; and adjusting means for adjusting a projection magnification of the reticle onto the member on the basis of the magnification variation obtained by said obtaining means.

37. The apparatus according to claim 36, wherein the mark is a position measurement mark used to align the reticle.

38. The apparatus according to claim 36, wherein the exposure region has a rectangular shape, and the parameter includes at least one of an area ratio of the exposure region to a predetermined reference square and an aspect ratio of the exposure region.

39. The apparatus according to claim 38, wherein the parameter includes the aspect ratio of the exposure region, and letting $\Delta\beta_M$ be a mark magnification variation amount measured by said measuring means, A be the aspect ratio, and $c_1$ and p be coefficients, said obtaining means obtains, as the magnification variation in the exposure region, $\Delta\beta_S$ given by $$\Delta\beta_S = c_1 \cdot A^p \cdot \Delta\beta_M.$$

40. The apparatus according to claim 38, wherein the parameter includes the area ratio, and letting $\Delta\beta_M$ be a mark magnification variation amount measured by said measuring means, S be the area ratio, and $c_2$ and q be coefficients, said obtaining means obtains, as the estimated magnification variation in the exposure region, $\Delta\beta_S$ given by $$\Delta\beta_S = c_2 \cdot S^q \cdot \Delta\beta_M.$$

41. The apparatus according to claim 38, wherein the parameter includes the aspect ratio and area ratio of the exposure region, and letting $\Delta\beta_M$ be a mark magnification variation amount measured by said measurement means, A be the aspect ratio, S be the area ratio, and c, p, and q be coefficients, said obtaining means obtains, as the magnification variation in the exposure region, $\Delta\beta_S$ given by $$\Delta\beta_S = c \cdot A^p \cdot S^q \cdot \Delta\beta_M.$$

42. The apparatus according to claim 36, wherein said adjusting means performs adjustment using a magnification correction function of the projection lens.

43. A control method for controlling an exposure apparatus for projecting illumination light irradiating a reticle onto a member to be exposed via an optical system, said control method comprising:

a step of measuring a displacement of a mark formed on the reticle with respect to a reference;

a step of obtaining a magnification variation in the exposure region on the basis of the displacement of the mark measured in the measuring step and information about at least one of a shape and a size of an exposure region on the reticle, by utilizing a predetermined relationship among the displacement, the information and the magnification variation; and a step of adjusting a projection magnification of the reticle onto the member on the basis of the magnification variation obtained in the obtaining step.

44. The method according to claim 43, wherein the mark is a position measurement mark used to align the reticle.

45. The method according to claim 43, wherein the exposure region has a rectangular shape, and the parameter includes at least one of an area ratio of the exposure region to be a predetermined reference square and an aspect ratio of the exposure region.

46. The method according to claim 45, wherein the parameter includes the aspect ratio of the exposure region, and letting $\Delta\beta_M$ be a mark magnification variation amount measured in the measuring step, A be the aspect ratio, and $c_1$ and p be coefficients, the obtaining step comprises obtaining, as the magnification variation in the exposure region, $\Delta\beta_S$ given by $$\Delta\beta_S = c_1 \cdot A^p \cdot \Delta\beta_M.$$

47. The method according to claim 45, wherein the parameter includes the area ratio, and letting $\Delta\beta_M$ be a mark magnification variation amount measured by said measurement means, S be the area ratio, and $c_2$ and q be coefficients, the obtaining step comprises obtaining, as the magnification variation in the exposure region, $\Delta\beta_S$ given by $$\Delta\beta_S = c_2 \cdot S^q \cdot \Delta\beta_M.$$

48. The method according to claim 45, wherein the parameter includes the aspect ratio and the area ratio, and letting $\Delta\beta_M$ be a mark magnification variation amount measured in the measuring step, A be the aspect ratio, S be the area ratio, and c, p, and q be coefficients, the obtaining step comprises obtaining, as the magnification variation in the exposure region, $\Delta\beta_S$ is given by $$\Delta\beta_S = c \cdot A^p \cdot S^q \cdot \Delta\beta_M.$$

49. The method according to claim 43, wherein the adjusting step comprises performing adjustment using a magnification correction function of the projection lens.

50. An exposure apparatus for projecting illumination light irradiating a reticle on a member to be exposed via an optical system, said apparatus comprising:

measuring means for measuring a displacement of a mark formed on the reticle with respect to a reference;

obtaining means for obtaining a magnification variation in the exposure region on the basis of the displacement of the mark measured by said measuring means and information about at least one of a shape and a size of an exposure region on the reticle, by utilizing a predetermined relationship among the displacement, the information and the magnification variation; and adjusting means for adjusting a projection magnification of the reticle onto the member on the basis of the magnification variation obtained by said obtaining means.

51. The apparatus according to claim 50, wherein the mark is a position measurement mark used to align the reticle.

52. The apparatus according to claim 50, wherein the exposure region has a rectangular shape, and the parameter includes at least one of an area ratio of the exposure region to a predetermined reference square and an aspect ratio of the exposure region.

53. The apparatus according to claim 52, wherein the parameter includes the aspect ratio of the exposure region, and letting $\Delta\beta_M$ be a mark magnification variation amount measured by said measurement means, A be the aspect ratio, and $c_1$ and p be coefficients, said obtaining means obtains, as the magnification variation in the exposure region, $\Delta\beta_S$ given by $$\Delta\beta_S = c_1 \cdot A^p \cdot \Delta\beta_M.$$

54. The apparatus according to claim 52, wherein the parameter includes the area ratio, and letting $\Delta\beta_M$ be a mark magnification variation amount measured by said measuring means, S be the area ratio, and $c_2$ and q be coefficients, said obtaining means obtains, as the estimated magnification variation in the exposure region, $\Delta\beta_S$ given by $$\Delta\beta_S = c_2 \cdot S^q \cdot \Delta\beta_M.$$

55. The apparatus according to claim 52, wherein the parameter includes the aspect ratio and area ratio of the exposure region, and letting $\Delta\beta_M$ be a mark magnification variation amount measured by said measuring means, A be the aspect ratio, S be the area ratio, and c, p, and q be coefficients, said obtaining means obtains, as the magnification variation in the exposure region, $\Delta\beta_S$ given by $$\Delta\beta_S = c \cdot A^p \cdot S^q \cdot \Delta\beta_M.$$

56. The apparatus according to claim 50, wherein said adjusting means performs adjustment using a magnification correction function of the projection lens.

* * * * *

UNITED STATES PATENT AND TRADEMARK OFFICE
CERTIFICATE OF CORRECTION

PATENT NO. : 6,433,351 B1
DATED : August 13, 2002
INVENTOR(S) : Masami Yonekawa

It is certified that error appears in the above-identified patent and that said Letters Patent is hereby corrected as shown below:

Column 9,
Line 52, "wit h" should read -- with --.

Column 13,
Line 42, "$\Delta\beta_s c \cdot A^p S^q \cdot \Delta\beta_M$." should read -- $\Delta\beta_s = c \cdot A^p S^q \cdot \Delta\beta_M$. --.

Column 16,
Line 42, "is" should be deleted.

Signed and Sealed this

Twenty-eighth Day of January, 2003

JAMES E. ROGAN
*Director of the United States Patent and Trademark Office*